United States Patent
Kliesch et al.

(10) Patent No.: US 9,373,737 B2
(45) Date of Patent: Jun. 21, 2016

(54) BIAXIALLY STRETCHED POLYMER FILM COMPRISING A DECARBOXYLATION CATALYST, ITS USE IN ELECTRICAL INSULATION APPLICATIONS, AND PROCESS FOR ITS PRODUCTION

(75) Inventors: Holger Kliesch, Ginsheim (DE); Bodo Kuhmann, Runkel (DE); Dagmar Klein, Ockenheim (DE); Annegrete Bursch, Ruedesheim (DE); Rainer Kurz, Bad Schwalbach (DE); Dirk Broeder, Schweppenhausen (DE); Ahmet Celalettin Turan, Adana (TR); Engin Kuçukaltun, Adana (TR); Murat Kolbasi, Adana (TR)

(73) Assignees: Mitsubishi Polyester Film GmbH, Wiesbaden (DE); Advansa SaSa Polyester Sanayi A.S., Adana (TR)

( * ) Notice: Subject to any disclaimer, the term of this patent is extended or adjusted under 35 U.S.C. 154(b) by 658 days.

(21) Appl. No.: 12/777,295

(22) Filed: May 11, 2010

(65) Prior Publication Data

US 2010/0292375 A1 Nov. 18, 2010

(30) Foreign Application Priority Data

May 15, 2009 (DE) .......................... 10 2009 021 566

(51) Int. Cl.
*C08K 3/16* (2006.01)
*H01L 31/048* (2014.01)
(Continued)

(52) U.S. Cl.
CPC .............. *H01L 31/048* (2013.01); *B32B 27/08* (2013.01); *B32B 27/18* (2013.01); *B32B 27/20* (2013.01); *B32B 27/36* (2013.01); *C08J 5/18* (2013.01);
(Continued)

(58) Field of Classification Search
CPC .............. C08K 3/16; C08K 3/32; C08K 3/01; C08K 5/0091; C08K 13/02; C08K 2201/019; C08L 67/00; C08L 67/02; C08L 67/03; B29D 7/01; C08J 5/18; B29C 55/005; B29K 2067/00–2067/06; B32B 27/36
USPC .................................... 524/114, 317; 523/500
See application file for complete search history.

(56) References Cited

U.S. PATENT DOCUMENTS 3,051,212 A 8/1962 Daniels
3,432,591 A 3/1969 Heffelfinger
(Continued)

FOREIGN PATENT DOCUMENTS

DE 195 26 405 A1 1/1997
DE 102 09 847 A1 9/2003
(Continued)

OTHER PUBLICATIONS

Sawada, S. et al., "Degradation Mechanisms of Poly(ethylene Terephthalate) Tire Yarn", J. Applied Polym. Sci. 1991, 42(4), 1041-1048.*

(Continued)

*Primary Examiner* — Richard A Huhn
(74) *Attorney, Agent, or Firm* — ProPat, L.L.C.

(57) ABSTRACT

Biaxially stretched film with polymeric constituents formed mainly of polyester in which the film includes at least one copper salt and one halide, with the resulting film having an AC (alternating current) dielectric strength of at least 100 kV/mm at 23° C. and 50 Hz. The invention further relates to the use of the film of the invention, in particular in solar modules, and also to a process for its production.

20 Claims, 1 Drawing Sheet

(51) Int. Cl.
- *B32B 27/36* (2006.01)
- *C08J 5/18* (2006.01)
- *H01B 3/42* (2006.01)
- *C08K 5/098* (2006.01)
- *C08K 5/16* (2006.01)
- *C08L 67/02* (2006.01)
- *B32B 27/08* (2006.01)
- *B32B 27/18* (2006.01)
- *B32B 27/20* (2006.01)
- *B29D 7/01* (2006.01)
- *C08L 67/03* (2006.01)
- *C08K 3/32* (2006.01)
- *C08K 13/02* (2006.01)
- *C08L 67/00* (2006.01)
- *C08K 5/00* (2006.01)
- *B29K 67/00* (2006.01)
- *B29C 55/00* (2006.01)

(52) U.S. Cl.
CPC . *C08K 5/098* (2013.01); *C08K 5/16* (2013.01); *C08L 67/02* (2013.01); *H01B 3/421* (2013.01); *H01L 31/0481* (2013.01); *B29C 55/005* (2013.01); *B29D 7/01* (2013.01); *B29K 2067/06* (2013.01); *B32B 2264/02* (2013.01); *B32B 2264/10* (2013.01); *B32B 2270/00* (2013.01); *B32B 2307/20* (2013.01); *B32B 2307/204* (2013.01); *B32B 2307/206* (2013.01); *B32B 2307/306* (2013.01); *B32B 2307/40* (2013.01); *B32B 2307/4026* (2013.01); *B32B 2307/50* (2013.01); *B32B 2307/518* (2013.01); *B32B 2307/71* (2013.01); *B32B 2307/712* (2013.01); *B32B 2307/714* (2013.01); *B32B 2457/12* (2013.01); *C08J 2367/00* (2013.01); *C08K 3/16* (2013.01); *C08K 3/32* (2013.01); *C08K 5/0091* (2013.01); *C08K 13/02* (2013.01); *C08K 2201/019* (2013.01); *C08L 67/00* (2013.01); *C08L 67/03* (2013.01); *Y02E 10/50* (2013.01)

(56) References Cited

U.S. PATENT DOCUMENTS

| | | |
|---|---|---|
| 3,446,766 A | 5/1969 | Taylor |
| 3,952,125 A | 4/1976 | Kuratsuji et al. |
| 6,984,694 B2 | 1/2006 | Blasius et al. |
| 2002/0065346 A1 | 5/2002 | Murschall et al. |
| 2003/0219614 A1* | 11/2003 | Kliesch et al. ............... 428/523 |
| 2007/0238816 A1* | 10/2007 | Kliesch et al. ............... 524/114 |
| 2007/0299184 A1* | 12/2007 | Bloom ......................... 524/437 |

FOREIGN PATENT DOCUMENTS

| | | |
|---|---|---|
| EP | 0 738 749 A1 | 10/1996 |
| EP | 1 842 662 A1 | 10/2007 |
| FR | 2 812 299 | 2/2002 |
| GB | 1048068 | 10/1965 |
| JP | 62-214928 | 9/1987 |
| JP | 64-069623 | 3/1989 |
| JP | 2000-234029 A | 8/2000 |
| JP | 2001-089582 A | 4/2001 |
| JP | 2008-007750 A | 1/2006 |
| JP | 2010-043373 A | 2/2010 |
| JP | 2010-116558 A | 5/2010 |

OTHER PUBLICATIONS

Definition of marked, adj. and n. Oxford English Dictionary online, retrieved on Sep. 29, 2015.*

McMahon et al., *Physical Properties Evaluation of Compounds and Materials*, Journal of Chemical Engineering Data, vol. 4, No. 1, pp. 57-78.

* cited by examiner

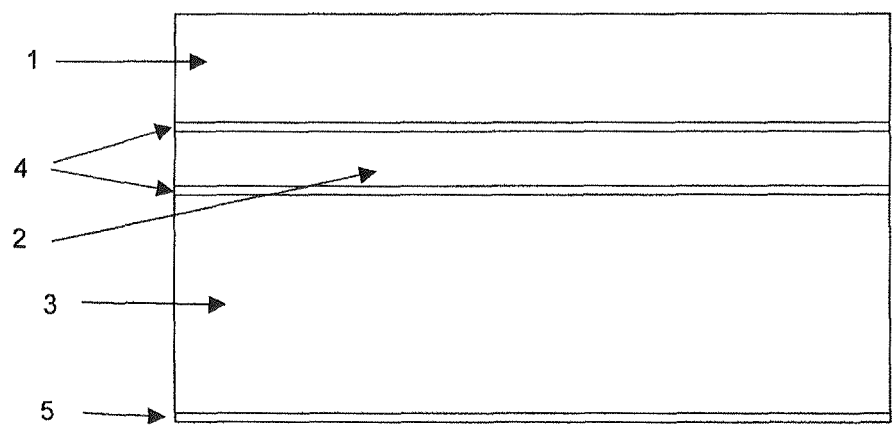

US 9,373,737 B2

BIAXIALLY STRETCHED POLYMER FILM COMPRISING A DECARBOXYLATION CATALYST, ITS USE IN ELECTRICAL INSULATION APPLICATIONS, AND PROCESS FOR ITS PRODUCTION

CROSS-REFERENCE TO RELATED APPLICATIONS

This application claims priority to German Patent Application 10 2009 021 566.2 filed May 15, 2009 which is hereby incorporated herein by reference in its entirety.

FIELD OF THE INVENTION

The invention relates to a biaxially stretched film comprised of a polyester, where the thickness of the film is preferably in the range from 6 to 500 μm. The film comprises at least one decarboxylation catalyst and features easy production, very good hydrolysis resistance, and good electrical insulation properties. The invention further relates to the use of the film and to a process for its production.

BACKGROUND OF THE INVENTION

Biaxially stretched films comprised of polyesters in the stated thickness range are well known.

Electrical applications, such as cables, motor insulation, or films for reverse-side laminates of solar modules, generally require relatively long lifetimes of a number of years, with some exposure to application temperatures which are in the region of the glass transition temperature of polyester (e.g. polyethylene terephthalate): about 78° C. Under these conditions, the susceptibility of the polyesters toward hydrolysis is a critical variable for lifetime in the application. It was shown quite some time ago (McMahon et al., Journal of Chemical Engineering Data, vol. 4 (1), pages 57 to 78, January 1959) that the viscosity here (a measure of the chain length of the polymer) must be at or above a certain level (from 0.3 to 0.33 being critical for IV). The favorable effect of low carboxy end group content (CEG content) on hydrolysis rate has likewise been known for a very long time (e.g. U.S. Pat. No. 3,051,212 of 1962). The processes used in industry for the production of polyesters having low carboxy end group content involve extremely precise process control and subsequent solid-phase polymerization. Polymers of this type are in particular used in the production of high-performance fibers.

The disadvantage of polymers of this type for application in polyester films is that in films it is an economic necessity to use regrind. For reasons associated with the process, the production of biaxially stretched polyester films generally requires from 1.5 to 2.5 kg of polymer for one kg of film. The excess produces edge strips and cut film, which is chopped and then directly reused, or first extruded and repelletized, and then reused. Carboxy end group content rises during film production and then particularly during downstream re-extrusion to produce regrind (repelletized material), and with this there is also a sharp rise in susceptibility to hydrolysis, and this restricts reuse of regrind, and can make this reuse impossible.

Another problem is the difficulty of achieving carboxy end group contents below 15 meq/kg by the post-condensation route. However, these contents are desirable for achieving the markedly reduced hydrolysis rates needed in the abovementioned end uses. If the intention was to achieve this by the postcondensation route, very long condensation times are needed (economically disadvantageous), and very high viscosities become desirable: >0.8 or even >0.85 for IV. However, as viscosity increases it becomes more difficult to process polymers of this type on conventional polyester film plants, since the extruders then draw high current levels and the high viscosity moreover leads to very large amounts of shear-generated heat, which then destroy the initially good hydrolysis properties by forming new carboxy end groups during the extrusion process.

Alongside the method described above for the production of polyesters having low carboxy end group content by way of process optimization and the additional process step of postcondensation (solid-phase condensation or solid-phase polymerization), many processes have been described for endcapping by reactive agents. Ethylene carbonate (e.g. DE-A-19526405, whose United States equivalent is U.S. Pat. No. 5,563,209) or else polymeric reactants, such as carbodiimides (US-A-2002/065346) are often mentioned. Disadvantages of these additives are evolution of irritant gaseous byproducts (particularly in the case of carbodiimides) or the deposition of degradation products or of the endcapping agent itself on the die or in the setting frame. Another factor is that once the endcapping agents have been consumed in the reaction they are ineffective, and formation of the carboxy end groups in the polymer recommences, resulting in the abovementioned regrind problem. The action of polymers and of other polyfunctional endcapping agents, such as carbodiimides, or polymers containing glycidyl groups, as described in EP-A-1 499 668 (whose United States equivalent is United States Patent Application Publication No. 2003/0216500 A1), is not restricted to reducing the number of end groups but also involves chain extension or indeed crosslinking, and this can lead to a viscosity rise that is difficult to control during the extrusion process.

Additives of this type also introduce foreign materials into the polyester, and these can impair the initially very good electrical insulation properties of polyester.

Very generally, additives such as those mentioned above increase costs (costs of the substance itself, and the costs of introduction into the polyester) and give rise to difficulties in process control.

U.S. Pat. No. 3,446,766 describes a method for reducing the number of end groups by using a decarboxylation reaction rather than reactive endcapping with an end group that remains within the product. Polymer production and resultant fibers are described, but there is no description of the production of biaxially stretched films and their use in electrical insulation applications.

SUMMARY OF ADVANTAGEOUS EMBODIMENTS OF THE INVENTION

It was an object of the present invention to provide a polyester film of thickness from 6 to 500 μm which avoids the abovementioned disadvantages of the prior art, can be produced at low costs, features good electrical insulation properties, and is thus suitable for use in electrical insulation applications, and within these is particularly suitable for the reverse-side laminates of solar modules.

BRIEF DESCRIPTION OF THE DRAWINGS

FIG. 1 is a schematic illustration of an exemplary laminate incorporating the inventive film.

DETAILED DESCRIPTION OF ADVANTAGEOUS EMBODIMENTS OF THE INVENTION

This is achieved via a biaxially stretched film comprised mainly of a polyester which comprises at least one copper salt and one halide. The AC (alternating current) dielectric strength of the film is at least 100 kV/mm, preferably at least 200 kV/mm, at 23° C. and 50 Hz.

The film comprises a polyester as main constituent. Examples of suitable polyesters are polyethylene terephthalate (PET), polyethylene naphthalate (PEN), polybutylene terephthalate (PBT), polytrimethylene terephthalate (PTT), bibenzene-modified polyethylene terephthalate (PETBB), bibenzene-modified polybutylene terephthalate (PBTBB), bibenzene-modified polyethylene naphthalate (PENBB), or a mixture thereof, preference being given to PET, PBT, PEN, and PTT, and also to their mixtures and copolyesters. It is preferable that the polymeric constituents of the film are comprised of 90% by weight, and particularly preferably 95% by weight, of a polyester. These percentages by weight are based on the film, unless otherwise stated—and this also applies hereinafter.

Other materials that can be used for the production of the polyesters, alongside the main monomers, such as dimethyl terephthalate (DMT), ethylene glycol (EG), propylene glycol (PG), 1,4-butanediol, terephthalic acid (TA), benzenedicarboxylic acid, and/or 2,6-naphthalenedicarboxylic acid (NDA), are isophthalic acid (IPA), trans- and/or cis-1,4-cyclohexanedimethanol (c-CHDM), t-CHDM, or c/t-CHDM), neopentyl glycol, and other suitable dicarboxylic acid components (or dicarboxylic esters), and diol components.

Preference is given to polymers in which the dicarboxylic acid component is comprised of 90% by weight or more (based on the total amount of the dicarboxylic acid component), in particular 98% by weight or more, of TA or NDA, particular preference being given to TA. Preference is further given to thermoplastics in which the diol component is comprised of 93% by weight or more, and more preferably 95% by weight or more, and in particular 97% by weight or more (based on the total amount of the diols), of EG. The respective dicarboxylic acid component or dicarboxylic acid content or diol component or diol content stated either above or below always means the respective repeat unit incorporated into the polymer.

All diol components other than EG have a tendency to reduce hydrolysis resistance and dielectric strength. The diethylene glycol content in the entire polymer of the film is therefore preferably in the range from 0.25 to 3% by weight, and a particularly preferred diethylene glycol content in the entire polymer is in the range of 0.4 to 1.2% by weight. In one preferred embodiment, the total content of propanediol and butanediol is <2% by weight, and particularly preferably <1% by weight. In one preferred embodiment, the content of cyclohexanedimethanol (monomer for PETG) is <3% by weight and particularly preferably <1% by weight.

All dicarboxylic acid components other than TA and NDA have a tendency to reduce hydrolysis resistance and dielectric strength. In one preferred embodiment, the content of isophthalic acid (IPA) is <4% by weight and particularly preferably <1% by weight. In one preferred application, the content of dicarboxylic acids other than TA, NDA, and IPA is <3% by weight and particularly preferably <1% by weight, for the reasons mentioned.

The film of the invention can moreover comprise inorganic or organic particles necessary to adjust surface topography or optical properties (gloss, haze, etc.). Examples of particles of this type are calcium carbonate, apatite, silicon dioxide, titanium dioxide, aluminum oxide, crosslinked polystyrene, crosslinked polymethyl methacrylate (PMMA), zeolites, and other silicates, such as aluminum silicates. The amounts generally used of these compounds are from 0.05 to 5% by weight, preferably from 0.1 to 0.6% by weight (based on the weight of the film). Particular preference is given here to calcium carbonate and silicon dioxide.

The median particle sizes ($d_{50}$) used in order to achieve good reliability of running in the production process are generally from 0.1 to 20 µm and preferably from 0.3 to 7 µm, and particularly preferably from 0.5 to 5 µm. Fibrous inorganic additives, such as glass fibers, are unsuitable since they make production of the polyester film uneconomic, because of the large number of break-offs.

In one preferred embodiment, the film is white. The white pigments can be identical with the abovementioned particles used to improve ease of winding, but the amount and particle size of these then has to be adequate to achieve white coloration. Particularly suitable white pigments are titanium dioxide, barium sulfate, zinc oxide, $CaCO_3$, or incompatible polymers, such as polypropylene, polyethylene, or COC, or a combination thereof. Amounts of these added to the polyester are from 1 to 35% by weight, the preferred amount added here being from 2 to 20% by weight (based on the total weight of the film). In this embodiment it is particularly preferable that the film comprises from 3 to 10% by weight of white pigment (based on the total weight of the film). The median particle sizes $d_{50}$ used in order to achieve good reliability of running and whiteness are generally from 0.05 to 5 µm and preferably from 0.1 to 1 µm. The preferred white pigments are zinc oxide and titanium dioxide, particular preference being given to titanium dioxide. Addition of $TiO_2$ is particularly preferred when the $TiO_2$ has been inorganically coated and optionally also organically coated. Addition of the $TiO_2$ firstly provides white coloration to the film (as is also the case when other white pigments are used), and increases electrical yield when the film is used for backsheets of solar modules, because the amount of reflected light is increased; secondly, it leads to an improvement in the UV resistance of the film or of the backsheet, and this is particularly advantageous for the outdoor use of the solar module. The inorganic coating reduces the catalytically active surface area of the $TiO_2$, which can cause yellowing of the film, while the organic coating has a favorable effect on the incorporation of the $TiO_2$ into the thermoplastic polyester. The median particle diameter $d_{50}$ of the $TiO_2$ is preferably in the range from 0.1 to 0.5 µm, particularly preferably from 0.15 to 0.3 µm. The amount added of the $TiO_2$ is advantageously from 2 to 25% by weight, preferably from 3 to 12% by weight, and particularly preferably from 4 to 8% by weight. The best reflection of light, and the best UV protection, are achieved by using $TiO_2$ in the rutile form.

The film can also comprise further components alongside the abovementioned additives, examples being flame retardants (preferably organic phosphoric esters) and/or UV stabilizers. FR-A-2812299 (whose United States equivalent is, inter alia, U.S. Pat. No. 7,166,653) reveals a selection of suitable UV stabilizers. Particular preference is given to UV stabilizers based on triazine, since these exhibit particularly adequate long-term stability (the requirement in solar modules mostly being more than 20 years). In one preferred embodiment, the amount added of UV stabilizers based on triazines is from 0.1 to 5% by weight (based on the total weight of the layer to which they are added). In particular in the case of white embodiments, addition of UV stabilizer to a layer below the layer facing toward the light source does not lead to any significant further improvement in UV resistance. In the case of multilayer films (and particularly in the case of white embodiments), therefore, the UV stabilizer is in particular added within the outer layer(s), while the layer(s) below the outer layer(s) comprise(s) no UV stabilizer at all, or only the amount introduced by way of regrind, i.e. preferably less than 60%, and particularly preferably less than 30%, of the percentage by weight of stabilizer present in the outer layer(s).

For good UV resistance of the film, it has proven advantageous that transparency in the UV-A region is <20% and preferably <10%, and ideally smaller than 5%, at 370 nm.

It has moreover proven advantageous that a stabilizer in the form of a free-radical scavenger is added to the film, since this can also improve long-term heat resistance. It is advantageous that the film of the invention comprises amounts of from 50 to 15 000 ppm, preferably from 100 to 5000 ppm, particularly preferably from 300 to 1000 ppm, based on the weight of the film, of stabilizers of this type as free-radical scavengers or heat stabilizers. The stabilizers added to the polyester are selected as desired from the group of the primary stabilizers, e.g. sterically hindered phenols or secondary aromatic amines, or from the group of the secondary stabilizers, e.g. thioethers, phosphites, and phosphonites, and also zinc dibutyldithiocarbamate or a synergistic mixture comprised of primary and secondary stabilizers. Preference is given to the phenolic stabilizers. Among the phenolic stabilizers are in particular sterically hindered phenols, thiobisphenols, alkylidenebisphenols, alkylphenols, hydroxybenzyl compounds, acylaminophenols, and hydroxyphenylpropionates (appropriate compounds being described by way of example in "Kunststoffadditive" [Plastics additives], 2nd edition, Gachter Muller, Carl Hanser-Verlag, and in "Plastics Additives Handbook", 5th edition, Dr. Hans Zweifel, Carl Hanser-Verlag). Particular preference is given to the stabilizers with the following CAS numbers: 6683-19-8, 36443-68-2, 35074-77-2, 65140-91-2, 23128-74-7, 41484-35-9, 2082-79-3, and also IRGANOX® 1222 from Ciba Specialties, Basle, CH, and in particular embodiments here preference is given to IRGANOX® 1010, IRGANOX® 1222, IRGANOX® 1330, and IRGANOX x® 1425, or a mixture thereof.

The film of the invention also comprises from 10 to 500 ppm, preferably from 20 to 80 ppm, of copper in the form of a copper salt, as part of a decarboxylation catalyst system. The salt is preferably a salt of Cu(II), i.e. copper in oxidation state 2. However, it can also be a Cu(I) salt, where the salt is preferably added in the form of Cu(II) salt to the polymer, since undesired discoloration can occur on addition of Cu(I) salts.

The counterion is preferably the mono- or polyvalent anion of a carboxylic acid (e.g. acetic acid or benzoic acid), of an amide, or of an acetyl analog of a carboxylic acid (e.g. acetylacetonate), amides being less preferred here because of a tendency toward discoloration. It is also possible to use other anions, e.g. sulfate or carbonate, but these generally lead to lower solubility of the copper salt in polyester and thus to a markedly lower reaction rate, and they are therefore less preferred. Particular preference is given to the anions of short-chain carboxylic acids having less than 8, and particularly preferably less than 5, and in particular less than 4, carbon atoms, but less preference is given to salts of formic acid.

The film comprises, alongside the copper salt, a halide selected from iodide, chloride, or bromide; iodide is preferred here because it leads to markedly better decarboxylation results. The halide is preferably added in the form of alkali metal salts; potassium salts achieve the best decarboxylation results here.

The film comprises from 15 to 600 ppm of halide, preferably from 30 to 250 ppm. In one preferred embodiment, the molar hal/Cu ratio is from 0.5 to 3.5 (hal=I⁻, Br⁻, or Cl⁻ without counterion, Cu=Cu(I) or Cu(II), preferably Cu(II)); the molar ratio is particularly preferably from 0.75 to 3.0, and very particularly preferably from 0.8 to 1.0. If the molar ratio is lower than these values, reaction rate is inadequate and decarboxylation is incomplete. If the molar ratio is markedly above 3.5, a high level of gas evolution takes place during the extrusion process, with marked discoloration of the film.

In one preferred embodiment, another reducing agent different from halide is added, alongside the halide, to a least one of the polymers used in the production of the film; this material is preferably hypophosphite or orthophosphite. This method can reduce the amount of halide and thus reduce discoloration. The amount added of the additional reducing agent is preferably such that the molar ratio of copper(II) to additional reducing agent is from 0.5 to 2.5.

It is preferable that addition of the decarboxylation catalyst mixture comprised of copper salt, halide, and, if appropriate, additional reducing agent during polyester production takes place at the start of the polycondensation process. If transesterification takes place prior to the polycondensation process (when dimethyl terephthalate (DMT) is used), the catalyst mixture is preferably added at the end of the transesterification process and prior to the polycondensation process. Addition during, or else at the end of, the polycondensation process is likewise possible, but leads to poorer hydrolysis-resistance results, and to more evolution of gas during film production, and is therefore less preferred. It is surprising that the addition can also give good results when it takes place prior to the polycondensation process, because GB-1,048,068 (whose United States equivalent is U.S. Pat. No. 3,446,766) recommend addition at the end of the polycondensation process.

Surprisingly, it has been found that the reduction in hydrolysis rate is almost identical when the decarboxylation catalyst system is uniformly present in 100% by weight of the raw materials for the polyesters and when it is added in a form similar to that of a catalyst masterbatch to just a portion of the raw materials for the polyesters. It is preferable that at least 20% by weight of the raw materials for the polyesters, and particularly preferable that at least 50% by weight of the raw materials for the polyesters, comprise the catalyst system. It is important here that the contents of copper salt and halide in the entire polyester mixture correspond to the abovementioned amounts.

It was also surprising that even when up to 50% by weight of regrind is used this does not lead to any marked increase in hydrolysis rate, whereas when polymers having low carboxy end group contents are used without a decarboxylation catalyst system as little as 25% by weight of regrind is sufficient to cause a rise of more than 30% in the hydrolysis rate.

In one preferred embodiment, the film comprises, alongside the decarboxylation catalyst system comprised of copper salt and halide (and, if appropriate, of other reducing agents), one or more hydrolysis stabilizers, such as carbodiimides or epoxidized fatty acid derivatives, preference being given here to epoxidized fatty acid derivatives (less irritant gases evolved). Although carbodiimides are—as described above—disadvantageous, to the extent that these disadvantages can be eliminated by other means, or if these disadvantages are unimportant, these materials can otherwise be very effective hydrolysis stabilizers, if appropriate in combination with the hydrolysis stabilizers of the invention, e.g. using a reduced amount. Particular preference is given to epoxidized linseed oil. The decarboxylation catalyst and hydrolysis stabilizer here exhibit an unexpected synergistic effect (hydrolysis resistance) despite the fact that, in order to exert their effect, the abovementioned hydrolysis stabilizers need carboxy end groups, and the number of these is greatly reduced by the catalyst system.

Chain extenders, such as oxazolines, or compounds containing a plurality of glycidyl groups can also be added (directly or in the form of a masterbatch) to the film during the production process, in order to increase the initial chain length of the polymer in the film. The difference between chain extenders and the hydrolysis stabilizers is that more than 90% of their reactive groups are consumed by reaction before completion of the extrusion process; although they therefore have a chain-extending effect in the process, they are not subsequently available as hydrolysis stabilizer during the service life of the film. Preferred chain extenders are polymers described by formula 1. Formula 1:

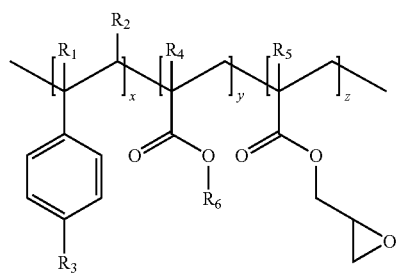

where $R_1$-$R_5$ independently of one another, are H or a $C_1$-$C_{12}$-alkyl moiety, preferably $CH_3$.

$R_6$ is a $C_1$-$C_{12}$-alkyl group, preferably $CH_3$.

x and y are from 0 to 100, and preferably from 1 to 20.

x+y is greater than 0, and preferably greater than 10.

z is from 2 to 100, preferably from 3 to 20, and particularly preferably from 3 to 10.

These data relate to the average of the polymers used (chain extenders), since individual polymer chains can have randomly distributed monomer contents which can deviate from the preferred ranges. These compounds feature particularly good binding into the polyester matrix, and simultaneously have very good chain-extending effect, with little tendency toward gelling. This is particularly true when at least two of the three monomer constituents x, y, and z are simultaneously within the preferred ranges. Polymers of this type are marketed with trademark JONCRYL® ADR by BASF AG. Particular preference is given here to the liquid products. The amounts added of these polymers (chain extenders) are usually less than 2% by weight and particularly preferably less than 1.2% by weight. The amount added here is usually at least 0.05% by weight, preferably at least 0.1% by weight, and particularly preferably at least 0.2% by weight (based on the total weight of the film).

In one preferred embodiment, the amount of hydrolysis stabilizer+chain extender+UV stabilizer is <10% by weight and particularly preferably <7% by weight, and in particular <5% by weight, since although these substances improve weathering resistance (UV degradation and hydrolysis) they also simultaneously disrupt the polyester network and thus have a tendency to reduce dielectric strength.

It is preferable that the chain extenders and hydrolysis stabilizers are directly fed into the extruder during film production. It is particularly preferable here that the viscosity of the melt is measured during the process (on-line) and that the feed of the chain extender is regulated in such a way as to achieve constant viscosity in the extrusion process.

However, the chain extender can also be added during polymer production or during regrind production. One preferred location during regrind production is addition to the extrusion process during production of the repelletized material from the production residues from film production. The SV value of the regrinds is advantageously adjusted here by way of the feed of the chain extenders in such a way as to correspond to the average SV value of the other polymers when these materials are again used for film production.

It is preferable to use multiscrew extruders (at least 2 screws).

Masterbatch technology can also be used to introduce the chain extender(s)/hydrolysis stabilizer(s). This means that the chain extender(s)/hydrolysis stabilizer(s) is/are introduced into the polymer (together or separately) within an extruder (preferably a multiscrew extruder). This/these polymer(s) is/are then re-extruded during film production, in pure form or in a mixture with other polymers. However, this process is less preferred, since chain extender is consumed (by reaction) before the first step of extrusion is complete, and is then not available as active substance within the film. This therefore requires the selection of particularly mild extrusion conditions which, unlike during film production, do not lead to complete (>75%) consumption of the active groups by reaction. This can be achieved by way of example via the selection of copolyesters with low melting point (e.g. polymers having more than 5% by weight, preferably more than 10% by weight, of IPA (isophthalic acid)), and via delayed addition of the chain extender within the extruder, i.e. avoiding direct addition within the feed section. However, this has an adverse effect on the hydrolysis rate of the films of the invention and is therefore less preferred.

The film of the invention is generally produced by extrusion processes known per se and has one or more layers, where the decarboxylation catalyst system and, if appropriate, the other additives, such as chain extenders/hydrolysis stabilizers, can be present in all of the layers, but there are also possible embodiments which do not equip all of the layers with the additives and, respectively, with the catalyst system. In one preferred embodiment, at least all of the external layers comprise the decarboxylation catalyst system, since embrittlement caused by hydrolysis has greater influence on the stability of the entire film than embrittlement of an inner layer, the integrity of which is maintained by the stabilizing outer layers.

The thickness of the films of the invention is from 6 to 500 μm and preferably from 36 to 350 μm, and particularly preferably from 49 to 300 μm.

The procedure for the production process for the film of the invention is advantageously as follows: the melts corresponding to the individual layers are extruded through a flat-film die, the resultant film is drawn off and quenched on one or more rolls (chill roll) for solidification in the form of substantially amorphous prefilm, the film is then reheated and biaxially stretched (oriented), and the biaxially stretched film is heat-set.

It has proven advantageous that the temperatures in the entire extrusion process do not exceed 295° C. and preferably 285° C., and ideally 280° C., since otherwise a significant amount of blistering takes place within the film.

In order to avoid blisters, it has also proven advantageous that the polymers that comprise the decarboxylation system are melted and extruded in a twin-screw extruder.

The biaxial orientation process is generally carried out sequentially. The orientation here preferably takes place first longitudinally (i.e. in machine direction=MD) and then transversely (i.e. perpendicularly to the machine direction=TD). This leads to orientation of the molecular chains. The longitudinal orientation can be achieved with the aid of two rolls running at different speeds corresponding to the desired stretching ratio. The transverse orientation process generally uses an appropriate tenter frame.

The temperature at which the orientation process is carried out can vary relatively widely, and depends on the desired properties of the film. The longitudinal stretching process, and also the transverse stretching process, is generally carried out at from $T_2+10°$ C. to $T_g+60°$ C. ($T_g$=glass transition temperature of the film). The longitudinal stretching ratio is generally in the range from 2.0:1 to 6.0:1, preferably from 3.0:1 to 4.5:1. The transverse stretching ratio is generally in the range from 2.0:1 to 5.0:1, preferably from 3.0:1 to 4.5:1, and the ratio for any second longitudinal and transverse stretching process carried out is from 1.1:1 to 5.0:1.

The longitudinal stretching process can, if appropriate, be carried out simultaneously with the transverse stretching process (simultaneous stretching).

In order to achieve the desired good electrical insulation properties, it has proven advantageous that the area stretching ratio (longitudinal times transverse) is greater than 5 or preferably greater than 7.5, and particularly preferably greater than 9.5. An area stretching ratio above has proven disadvantageous in terms of the reliability of running of the film. Area stretching ratios greater than 25 are likewise undesirable, since in this range a reversal of dielectric strength begins to become apparent. The abovementioned area stretching ratios lead to films which preferably have a modulus of elasticity greater than 2500 N/mm$^2$ in each direction on the film, and particularly preferably greater than 3000 N/mm$^2$ in each direction on the film, and very preferably greater than 3500 N/mm$^2$ in each direction on the film, but preferably no modulus of elasticity greater then 7000 N/mm$^2$ in any direction on the film.

The abovementioned stretching ratios lead to films whose tensile strain at break is adequate to provide the flexibility needed for the mechanical loads arising during the manufacture of, and in the use of, reverse-side insulation for solar modules (an example being wind load). Tensile strain at break should be greater than 10% in each direction on the film, preferably being greater than 25% in each direction on the film, and particularly preferably being greater than 50%. For achievement of said tensile strain at break values it has proven advantageous that the area stretching ratio is smaller than 20 and preferably smaller than 18.

In the heat-setting process that follows the stretching process, the film is kept at a temperature of from 150 to 260° C., preferably from 200 to 245° C., for a period of about 0.1 to 10 s. Subsequently to the heat-setting process, or beginning within that process, the film is relaxed by from 0.5 to 15%, preferably by from 2 to 8%, transversely and, if appropriate, also longitudinally, and it is then conventionally cooled and wound.

In one preferred embodiment, the shrinkage of the films of the invention at 150° C. (15 min) in both directions on the film (MD and TD) is below 2%, preferably below 1.5%, and particularly preferably below 1.3% in both directions on the film. This can be achieved by adjusting the maximum temperature in the setting process to be greater than 210° C. and preferably greater than 230° C., and particularly preferably greater than 238° C. For the same reason, it is preferable that the amount of transverse relaxation carried out is above 3%, and it is preferable that at least 30% of said relaxation is carried out at temperatures below 200° C. The low shrinkage is particularly important for the use in reverse-side laminates of solar modules, since relatively high temperatures occur in the lamination process and, if shrinkage values are higher, can lead to relatively high losses of film and also can produce corrugations and creases.

Films that comprise the decarboxylation catalyst system of the invention have excellent suitability for electrical insulation applications, particularly in situations demanding long lifetime (years) and relatively high temperatures (>60° C.) and humidity (more than 10% relative humidity), since the films of the invention retain their good electrical properties for a long period even in conditions which are hot and humid. Examples of these applications are ribbon cables in automobiles, cables in seat heating systems, motor insulation, and especially reverse-side insulation in solar modules. The film can be used here either alone or else in the form of laminate with other films. FIG. 1 depicts a typical laminate, where 1 is a 50 µm white polyester film with decarboxylation catalyst system, 2 is a 12 µm $SiO_x$-vapor-coated polyester film (e.g. X-BARRIER® film from Mitsubishi Plastics, Inc., JP), 3 is a 100 µm white polyester film (e.g. HOSTAPHAN® WDW/WUV or WO/UVO film), 4 is an adhesive layer, and 5 is an adhesive layer relating to the EVA embedding material of the solar module.

The stated standards and methods are used to measure each of the properties in the examples below.

Test Methods

Standard Viscosity (SV)

Standard viscosity SV is measured—by a method based on DIN 53726—via measurement of relative viscosity $\eta_{rel.}$ of a 1% strength by weight solution in dichloroacetic acid (DCA) in an Ubbelohde viscometer at 25° C. The SV value is defined as follows:

$$SV=(\eta_{rel.}-1)\cdot 1000$$

Shrinkage

Heat shrinkage is determined on square samples of film of edge length 10 cm. The specimens are cut out in such a way that one edge runs parallel to the machine direction and one edge runs perpendicularly to the machine direction. The specimens are measured precisely (edge length $L_0$ being determined for each of the machine directions TD and MD, $L_{0\ TD}$ and to $L_{0\ MD}$), and they are heat-conditioned in a convection oven for 15 minutes at the stated shrinkage temperature (in this case 150° C.). The specimens are removed and measured precisely at room temperature (edge length $L_{TD}$ and $L_{MD}$). The shrinkage is obtained from the equation $$\text{shrinkage [\%] } MD=100\cdot(L_{0\ MD}-L_{MD})/L_{0\ MD}$$

$$\text{shrinkage [\%] } TD=100\cdot(L_{0\ TD}-L_{TD})/L_{0\ TD}$$

Measurement of Transparency at 370 nm

Transparency is measured using a LAMBDA® 3 UV/Vis spectrometer from Perkin Elmer.

Measurement of Dielectric Strength

Dielectric strength is measured to DIN 53481-3 (taking DIN 40634 into account for the specific instructions relating to films). A ball-and-plate system (electrode diameter 49.5 mm) was used for the measurement, with 50 Hz sinusoidal alternating voltage at 23° C. and rel. humidity 50, in air.

Measurement of Median Particle Diameter $d_{50}$ on Particles Prior to Introduction into the Polymer Median particle diameter $d_{50}$ is determined by means of a laser on a MASTERSIZER® (Malvern Instruments, UK) by the standard method (other measurement equipment being, for example, the Horiba LA® 500 (Horiba Ltd., JP) or HELOS® (Sympatec GmbH, DE), which use the same principle of measurement). For the measurement, the specimens are placed in a cell with water and the cell is then placed in the measurement equipment. The measurement procedure is automatic and also includes the mathematical determination of the $d_{50}$ value. The $d_{50}$ value here is defined as determined from the (relative) cumulative particle size distribution curve: the intersection of the 50% ordinate value with the cumulative curve provides the desired $d_{50}$ value on the abscissa axis.

Measurement of Mechanical Properties of the Film

Mechanical properties are determined to DIN EN ISO 527-1 to 3.

Autoclaving Process

The films (10×2 cm) are suspended on a wire in the autoclave (Adolf Wolf SANOKLAV®: ST-MCS-204), and 2 l of water are charged to the autoclave. The autoclave is sealed and then heated. At 100° C., steam is used to displace the air through the discharge valve. This is closed after about 5 min, whereupon the temperature rises to 110° C. and the pressure rises to from 1.2 to 1.5 bar. After the set time, the autoclave is automatically switched off, and the films are removed after opening the discharge valve. The SV value of the films is then determined.

EXAMPLES

Method: the raw materials were mixed and extruded in a twin-screw extruder from Japan Steel Works, with devolatilization. The maximum temperature in the extruder zones and in the melt line was 278° C. Throughput was 2000 kg per hour. The melt was extruded through a slot die (temperature 280° C.) onto a chill roll (30° C.), and then stretched longitudinally at 110° C. by a factor of 3.2, and then stretched transversely at 115° C. by a factor of 3.5.

The film was then subjected to a setting process at from 180 to 242° C. (one setting section at 180° C. and 2 setting sections at 242° C.), where the final section was adjusted for 2% transverse relaxation. The two downstream setting sections had been adjusted to 190° C. and 150° C., and the amount of relaxation here amounted to a further 3%. The total residence time in the setting process was 15 s.

Raw Materials Used:

R1=polyethylene terephthalate 8610 (produced by Invista, USA), solid-phase-condensed up to IV=0.68 (measured as stated in U.S. Pat. No. 3,432,591), SV=885; carboxy end group content CEG was 10 mmol/kg (measured as stated in EP-A-0 738 749, whose United States equivalent is U.S. Pat. No. 6,020,056). The low CEG was achieved without decarboxylation catalyst or other additives, solely by way of very precise process control. IPA content <0.3% by weight and DEG=1.0% by weight.

R2=40% by weight of polyethylene terephthalate and 60% by weight of $TiO_2$, TI-PURE® R-104 from DuPont, USA, produced by kneading to incorporate the $TiO_2$ into the polyester in a twin-screw extruder. The SV value was 700, and CEG content was 50 mmol/kg (based on polymer content), and DEG=1.2% by weight (based on polymer content).

R3=RT49 polyethylene terephthalate from Invista, Del., with SV=810 and CEG=19 mmol/kg and DEG=0.61% by weight.

R4=polyethylene terephthalate with 200 g/t of copper(II) acetate monohydrate (CAS 6046-93-1) and 150 g/t of potassium iodide (CAS 7681-11-0) and 50 g/t of sodium hypophosphite monohydrate (CAS 10039-56-2) with SV 890 and DEG 0.9% by weight and CEG 9 mmol/kg. Copper salt, iodide, and hypophosphite added after conclusion of the transesterification process.

R5=polyethylene terephthalate with 400 g/t of copper(II) acetate monohydrate (CAS 6046-93-1) and 350 g/t of potassium iodide (CAS 7681-11-0) and 100 g/t of sodium hypophosphite monohydrate (CAS 10039-56-2) with SV 850 and DEG 1.2% by weight and CEG 6 mmol/kg. Copper salt, iodide, and hypophosphite added after conclusion of the transesterification process.

R6=epoxidized linseed oil with 8.9% epoxy oxygen content from Arkema, USA.

The properties of the films can be found in Table 1.

TABLE 1

| Property | | Inventive example | | | | Comparative example | |
|---|---|---|---|---|---|---|---|
| | | 1 | 2 | 3 | 4 | 1 | 2 |
| | Raw material | | | | | | |
| | R1 (% by wt.) | | | | | 91 | 70.5 |
| | R2 (% by wt.) | 9 | 4.5 | 9 | 9 | 9 | 4.5 |
| | R3 (% by wt.) | | | | 41 | | |
| | R4 (% by wt.) | 91 | 45.5 | | 86 | | |
| | R5 (% by wt.) | | | 50 | | | |
| | R6 (% by wt.) | | | | 5 | | |
| | Regrind (% by wt.) | 0 | 50 | 0 | 0 | | 25 |
| Thickness | in μm | 50 | 50 | 50 | 50 | 50 | 50 |
| Hydrolysis rate after 144 h in autoclave | in SV/h | −1.6 | −1.75 | −1.6 | −0.35 | −1.95 | −2.7 |
| Longitudinal shrinkage | in % | 1.20 | 1.10 | 1.00 | 1.20 | 1.20 | 1.20 |
| Transverse shrinkage | in % | 0.20 | 0.30 | 0.10 | 0.40 | 0.30 | 0.20 |
| Longitudinal modulus of elasticity | in N/mm$^2$ | 4215 | 4163 | 4196 | 3876 | 4231 | 4205 |
| Transverse modulus of elasticity | in N/mm$^2$ | 4751 | 4623 | 4829 | 4100 | 4718 | 4786 |
| Longitudinal tensile strain at break | in % | 65 | 62 | 61 | 72 | 68 | 63 |
| Transverse tensile strain at break | in % | 64 | 65 | 68 | 85 | 71 | 69 |

TABLE 1-continued

| Property | | Inventive example | | | | Comparative example | |
|---|---|---|---|---|---|---|---|
| | | 1 | 2 | 3 | 4 | 1 | 2 |
| Dielectric strength | in kV/mm | 328 | 314 | 330 | 292 | 324 | 319 |
| Dielectric strength after 144 h in autoclave | in kV/mm | 288 | 251 | 278 | 285 | 197 | 74 |
| Transparency at 370 nm | in % | <5 | <5 | <5 | <5 | <5 | <5 |

That which is claimed is:

1. A biaxially stretched electrical insulating film comprising polymeric constituents mainly comprised of polyester, wherein the film further comprises a decarboxylation catalyst mixture as sole hydrolysis stabilizer, said decarboxylation catalyst composing at least one copper salt and one halide, said copper salt present in an amount ranging from 10 to 500 ppm and the alternating current dielectric strength of the film is at least 100 kV/mm at 23° C and 50 Hz,
wherein the molar ratio of halide to Cu is from 0.5 to 1.0.

2. The film as claimed in claim 1, wherein the copper salt is a salt of Cu(II).

3. The film as claimed in claim 1, wherein the copper salt counterion of the copper is a mono- or polyvalent anion of a carboxylic acid, of an amide, or of an acetyl analog of a carboxylic acid.

4. The film as claimed in claim 1, wherein the halide is selected from iodide, chloride, or bromide.

5. The film as claimed in claim 1, wherein the halide is an alkali metal halide.

6. The film as claimed in claim 1, wherein said film comprises, based on the mass of the film, from 15 to 600 ppm of halide.

7. The film as claimed in claim 1, wherein the molar ratio of halide to Cu is from 0.75 to 1.0.

8. The film as claimed in claim 1, wherein a reducing agent different from halide is present at a molar ratio of copper(II) to reducing agent that differs from halide of from 0.5 to 2.5.

9. The film as claimed in claim 1, wherein said polymeric constituent consists of polyester, said polyester is polyethylene terephthalate, said copper salt is copper (II) acetate monohydrate; said halide is potassium iodide, sodium hypophosphite monohydrate is present as a reducing agent different from halide,
said potassium iodide and said sodium hypophosphite monohydrate are present at a 3:0 :1 or 3,5: 1 weight ratio and said film exhibits a loss in dielectric strength of from 12 to 20% after 144 hours within an autoclave at 110°C.

10. The film as claimed in claim 1, Wherein said film further comprises one or more chain extenders, and the chain extender is a polymer described by formula 1

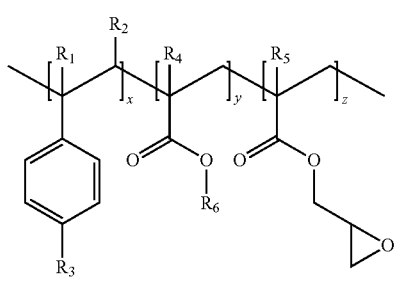

Formula 1 where $R_1$-$R_5$ independently of one another, are H or a $C_1$-$C_{12}$-alkyl moiety, $R_6$ is a $C_1$-$C_{12}$-alkyl group, x and y are from 0 to 100, x+y is greater than 0, and z is from 2 to 100, and the foregoing definitions relate to the average of the polymers used in the chain extender.

11. The film as claimed in claim 10, wherein the amount of the chain extender present in the film is less than 2% by weight and at least 0.05% by weight.

12. The film as claimed in claim 10, wherein said film does not comprise inorganic or organic particles that are necessary to adjust surface topography or optical properties.

13. The film as claimed in claim 1. wherein the polyester is formed using a polycondensation process and the copper salt and halide are added at the start of or prior to the polycondensation process.

14. The film as claimed in claim 1, wherein said film comprises the decarboxylation catalyst system within all external layers alone.

15. The film as claimed in claim 1, wherein said film further comprises 50% by weight of regrind formed from film having a higher carboxy end group content than said film.

16. The film as claimed in claim 15, wherein said film further comprises inorganically coated $TiO_2$ that has optionally been organically coated.

17. Electrical insulation comprising film as claimed in claim 1.

18. A laminate comprising at least one film as claimed in claim 1 and at least one further film.

19. A solar module comprising a film as claimed in claim 1.

20. A process for producing a film as claimed in claim 1 comprising extruding melts corresponding to individual layers of the film through a flat-film die, drawing of the resultant extruded film and quenching the drawn off film on one or more rolls for solidification in the form of a substantially amorphous prefilm, reheating and biaxially stretching the substantially amorphous prelim to orient it, heat-setting the biaxially stretched film and winding the heat-set film up, wherein said film comprises at least one copper salt and one halide.

* * * * *